(12) United States Patent
Hiatt et al.

(10) Patent No.: US 12,014,958 B2
(45) Date of Patent: *Jun. 18, 2024

(54) MICROFEATURE WORKPIECES AND METHODS FOR FORMING INTERCONNECTS IN MICROFEATURE WORKPIECES

(71) Applicant: Micron Technology, Inc., Boise, ID (US)

(72) Inventors: William M. Hiatt, Eagle, ID (US); Ross S. Dando, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/047,049

(22) Filed: Oct. 17, 2022

(65) Prior Publication Data

US 2023/0106554 A1 Apr. 6, 2023

Related U.S. Application Data

(60) Continuation of application No. 16/991,965, filed on Aug. 12, 2020, now Pat. No. 11,476,160, which is a
(Continued)

(51) Int. Cl.
*H01L 21/768* (2006.01)
*H01L 23/48* (2006.01)
(Continued)

(52) U.S. Cl.
CPC ...... *H01L 21/76898* (2013.01); *H01L 23/481* (2013.01); *H01L 23/49827* (2013.01); *H01L 23/5384* (2013.01); *H01L 2224/13025* (2013.01)

(58) Field of Classification Search
CPC ......... H01L 21/76898; H01L 23/49827; H01L 23/5384; H01L 23/481
See application file for complete search history.

(56) References Cited

U.S. PATENT DOCUMENTS 2,821,959 A 2/1958 Franz
3,006,318 A 10/1961 Monroe et al.
(Continued)

FOREIGN PATENT DOCUMENTS

DE 10205026 C1 5/2003
EP 0127946 A1 12/1984
(Continued)

OTHER PUBLICATIONS

"Aachboun, S. and P. Ranson, "Cryogenic etching of deep narrow trenches in silicon," J. Vac. Sci. Technol. A 18 (4), Jul./Aug. 2000, pp. 1848-1852."
(Continued)

*Primary Examiner* — David A Zarneke
(74) *Attorney, Agent, or Firm* — Perkins Coie LLP

(57) ABSTRACT

Methods for forming interconnects in microfeature workpieces, and microfeature workpieces having such interconnects are disclosed herein. The microfeature workpieces may have a terminal and a substrate with a first side carrying the terminal and a second side opposite the first side. In one embodiment, a method includes (a) constructing an electrically conductive interconnect extending from the terminal to at least an intermediate depth in the substrate with the interconnect electrically connected to the terminal, and (b) removing material from the second side of the substrate so that a portion of the interconnect projects from the substrate.

7 Claims, 6 Drawing Sheets

Related U.S. Application Data continuation of application No. 15/662,204, filed on Jul. 27, 2017, now abandoned, which is a division of application No. 12/965,301, filed on Dec. 10, 2010, now abandoned, which is a division of application No. 11/217,169, filed on Sep. 1, 2005, now Pat. No. 7,863,187.

(51) Int. Cl.
    *H01L 23/498*     (2006.01)
    *H01L 23/538*     (2006.01)

(56) References Cited

U.S. PATENT DOCUMENTS

| | | | |
|---|---|---|---|
| 3,345,134 | A | 10/1967 | Gero et al. |
| 3,865,298 | A | 2/1975 | Allen et al. |
| 3,902,036 | A | 8/1975 | Zaleckas |
| 4,040,168 | A | 8/1977 | Huang |
| 4,368,106 | A | 1/1983 | Anthony |
| 4,534,100 | A | 8/1985 | Lane |
| 4,581,301 | A | 4/1986 | Michaelson |
| 4,608,480 | A | 8/1986 | Bizot et al. |
| 4,614,427 | A | 9/1986 | Koizumi et al. |
| 4,627,971 | A | 12/1986 | Ayer |
| 4,660,063 | A | 4/1987 | Anthony |
| 4,756,765 | A | 7/1988 | Woodroffe |
| 4,768,291 | A | 9/1988 | Palmer |
| 4,818,728 | A | 4/1989 | Rai et al. |
| 4,907,127 | A | 3/1990 | Lee |
| 4,959,705 | A | 9/1990 | Lemnios et al. |
| 4,964,212 | A | 10/1990 | Deroux-Dauphin et al. |
| 4,984,597 | A | 1/1991 | McConnell et al. |
| 5,006,922 | A | 4/1991 | McShane et al. |
| 5,024,966 | A | 6/1991 | Dietrich et al. |
| 5,026,964 | A | 6/1991 | Somers et al. |
| 5,027,184 | A | 6/1991 | Soclof |
| 5,037,782 | A | 8/1991 | Nakamura et al. |
| 5,098,864 | A | 3/1992 | Mahulikar |
| 5,102,829 | A | 4/1992 | Cohn |
| 5,123,902 | A | 6/1992 | Mueller et al. |
| 5,144,412 | A | 9/1992 | Chang et al. |
| 5,145,099 | A | 9/1992 | Wood et al. |
| 5,158,911 | A | 10/1992 | Quentin |
| 5,200,366 | A | 4/1993 | Yamada et al. |
| 5,219,344 | A | 6/1993 | Yoder |
| 5,233,448 | A | 8/1993 | Wu |
| 5,237,148 | A | 8/1993 | Aoki et al. |
| 5,289,631 | A | 3/1994 | Koopman et al. |
| 5,291,062 | A | 3/1994 | Higgins |
| 5,292,686 | A | 3/1994 | Riley et al. |
| 5,294,568 | A | 3/1994 | McNeilly et al. |
| 5,304,743 | A | 4/1994 | Sen et al. |
| 5,378,312 | A | 1/1995 | Gifford et al. |
| 5,378,313 | A | 1/1995 | Pace |
| 5,380,681 | A | 1/1995 | Hsu |
| 5,402,435 | A | 3/1995 | Shiono et al. |
| 5,406,630 | A | 4/1995 | Piosenka et al. |
| 5,424,573 | A | 6/1995 | Kato et al. |
| 5,438,212 | A | 8/1995 | Okaniwa |
| 5,447,871 | A | 9/1995 | Goldstein |
| 5,464,960 | A | 11/1995 | Hall et al. |
| 5,481,483 | A | 1/1996 | Ebenstein |
| 5,485,039 | A | 1/1996 | Fujita et al. |
| 5,496,755 | A | 3/1996 | Bayraktaroglu |
| 5,515,167 | A | 5/1996 | Ledger et al. |
| 5,518,956 | A | 5/1996 | Liu et al. |
| 5,550,403 | A | 8/1996 | Carichner |
| 5,585,308 | A | 12/1996 | Sardella |
| 5,585,675 | A | 12/1996 | Knopf |
| 5,614,743 | A | 3/1997 | Mochizuki |
| 5,618,752 | A | 4/1997 | Gaul |
| 5,624,437 | A | 4/1997 | Freeman et al. |
| 5,627,106 | A | 5/1997 | Hsu |
| 5,646,067 | A | 7/1997 | Gaul |
| 5,654,221 | A | 8/1997 | Cronin et al. |
| 5,673,846 | A | 10/1997 | Gruber |
| 5,684,642 | A | 11/1997 | Zumoto et al. |
| 5,690,841 | A | 11/1997 | Elderstig |
| 5,718,791 | A | 2/1998 | Spengler |
| 5,723,904 | A | 3/1998 | Shiga |
| 5,726,493 | A | 3/1998 | Yamashita et al. |
| 5,734,555 | A | 3/1998 | McMahon |
| 5,771,158 | A | 6/1998 | Yamagishi et al. |
| 5,773,359 | A | 6/1998 | Mitchell et al. |
| 5,776,824 | A | 7/1998 | Farnworth et al. |
| 5,807,439 | A | 9/1998 | Akatsu et al. |
| 5,811,799 | A | 9/1998 | Wu |
| 5,821,532 | A | 10/1998 | Beaman et al. |
| 5,825,080 | A | 10/1998 | Imaoka et al. |
| 5,826,628 | A | 10/1998 | Hamilton |
| 5,847,454 | A | 12/1998 | Shaw et al. |
| 5,851,845 | A | 12/1998 | Wood et al. |
| 5,857,963 | A | 1/1999 | Pelchy et al. |
| 5,861,654 | A | 1/1999 | Johnson |
| 5,870,289 | A | 2/1999 | Tokuda et al. |
| 5,870,823 | A | 2/1999 | Bezama et al. |
| 5,893,828 | A | 4/1999 | Uram |
| 5,904,499 | A | 5/1999 | Pace |
| 5,969,422 | A | 10/1999 | Ting et al. |
| 5,998,240 | A | 12/1999 | Hamilton et al. |
| 5,998,292 | A | 12/1999 | Black et al. |
| 6,004,867 | A | 12/1999 | Kim et al. |
| 6,007,719 | A | 12/1999 | Yoo et al. |
| 6,008,070 | A | 12/1999 | Farnworth |
| 6,008,914 | A | 12/1999 | Sasagawa et al. |
| 6,080,291 | A | 6/2000 | Woodruff et al. |
| 6,087,719 | A | 7/2000 | Tsunashima |
| 6,097,087 | A | 8/2000 | Farnworth et al. |
| 6,103,547 | A | 8/2000 | Corisis et al. |
| 6,107,180 | A | 8/2000 | Munroe et al. |
| 6,107,186 | A | 8/2000 | Erb |
| 6,107,679 | A | 8/2000 | Noguchi |
| 6,110,825 | A | 8/2000 | Mastromatteo et al. |
| 6,114,240 | A | 9/2000 | Akram et al. |
| 6,119,335 | A | 9/2000 | Park et al. |
| 6,124,634 | A | 9/2000 | Akram et al. |
| 6,130,141 | A | 10/2000 | Degani et al. |
| 6,133,622 | A | 10/2000 | Corisis et al. |
| 6,137,163 | A | 10/2000 | Kim et al. |
| 6,137,182 | A | 10/2000 | Hause et al. |
| 6,140,604 | A | 10/2000 | Somers et al. |
| 6,143,588 | A | 11/2000 | Glenn |
| 6,148,509 | A | 11/2000 | Schoenfeld et al. |
| 6,159,764 | A | 12/2000 | Kinsman et al. |
| 6,180,518 | B1 | 1/2001 | Layadi et al. |
| 6,184,060 | B1 | 2/2001 | Siniaguine |
| 6,184,465 | B1 | 2/2001 | Corisis |
| 6,187,615 | B1 | 2/2001 | Kim et al. |
| 6,191,487 | B1 | 2/2001 | Rodenbeck et al. |
| 6,203,539 | B1 | 3/2001 | Shimmick et al. |
| 6,221,769 | B1 | 4/2001 | Dhong et al. |
| 6,222,136 | B1 | 4/2001 | Appelt et al. |
| 6,222,270 | B1 | 4/2001 | Lee |
| 6,228,687 | B1 | 5/2001 | Akram et al. |
| 6,229,202 | B1 | 5/2001 | Corisis |
| 6,235,552 | B1 | 5/2001 | Kwon et al. |
| 6,246,108 | B1 | 6/2001 | Corisis et al. |
| 6,252,300 | B1 | 6/2001 | Hsuan et al. |
| 6,268,114 | B1 | 7/2001 | Wen et al. |
| 6,271,580 | B1 | 8/2001 | Corisis |
| 6,277,757 | B1 | 8/2001 | Lin |
| 6,291,894 | B1 | 9/2001 | Farnworth et al. |
| 6,294,837 | B1 | 9/2001 | Akram et al. |
| 6,297,155 | B1 | 10/2001 | Simpson et al. |
| 6,324,253 | B1 | 11/2001 | Yuyama et al. |
| 6,326,689 | B1 | 12/2001 | Thomas |
| 6,326,697 | B1 | 12/2001 | Farnworth |
| 6,329,632 | B1 | 12/2001 | Fournier et al. |
| 6,341,009 | B1 | 1/2002 | OConnor et al. |
| 6,344,976 | B1 | 2/2002 | Schoenfeld et al. |
| 6,359,254 | B1 | 3/2002 | Brown |
| 6,359,328 | B1 | 3/2002 | Dubin |
| 6,372,548 | B2 | 4/2002 | Bessho et al. |

(56) References Cited

U.S. PATENT DOCUMENTS

| | | | |
|---|---|---|---|
| 6,388,208 B1 | 5/2002 | Kiani et al. |
| 6,391,770 B2 | 5/2002 | Kosaki et al. |
| 6,406,636 B1 | 6/2002 | Vaganov |
| 6,432,821 B1 | 8/2002 | Dubin et al. |
| 6,433,303 B1 | 8/2002 | Liu et al. |
| 6,433,304 B2 | 8/2002 | Okumura et al. |
| 6,437,284 B1 | 8/2002 | Okamoto et al. |
| 6,437,441 B1 | 8/2002 | Yamamoto |
| 6,441,487 B2 | 8/2002 | Elenius et al. |
| 6,444,576 B1 | 9/2002 | Kong |
| 6,448,106 B1 | 9/2002 | Wang et al. |
| 6,452,270 B1 | 9/2002 | Huang |
| 6,455,425 B1 | 9/2002 | Besser et al. |
| 6,457,515 B1 | 10/2002 | Vafai et al. |
| 6,459,039 B1 | 10/2002 | Bezama et al. |
| 6,459,150 B1 | 10/2002 | Wu et al. |
| 6,468,889 B1 | 10/2002 | Jacoponi et al. |
| 6,486,083 B1 | 11/2002 | Mizuno et al. |
| 6,486,549 B1 | 11/2002 | Chiang |
| 6,498,381 B2 | 12/2002 | Halahan et al. |
| 6,521,516 B2 | 2/2003 | Monzon et al. |
| 6,521,530 B2 | 2/2003 | Peters et al. |
| 6,534,192 B1 | 3/2003 | Abys et al. |
| 6,534,863 B2 | 3/2003 | Walker et al. |
| 6,545,563 B1 | 4/2003 | Smith |
| 6,555,782 B2 | 4/2003 | Isaji et al. |
| 6,560,047 B2 | 5/2003 | Choi et al. |
| 6,569,711 B1 | 5/2003 | Susko et al. |
| 6,569,777 B1 | 5/2003 | Hsu et al. |
| 6,572,606 B2 | 6/2003 | Kliewer et al. |
| 6,576,531 B2 | 6/2003 | Peng et al. |
| 6,580,174 B2 | 6/2003 | McCormick et al. |
| 6,582,987 B2 | 6/2003 | Jun et al. |
| 6,582,992 B2 | 6/2003 | Poo et al. |
| 6,593,644 B2 | 7/2003 | Chiu et al. |
| 6,599,436 B1 | 7/2003 | Matzke et al. |
| 6,606,251 B1 | 8/2003 | Kenny et al. |
| 6,614,033 B2 | 9/2003 | Suguro et al. |
| 6,620,031 B2 | 9/2003 | Renteln |
| 6,620,731 B1 | 9/2003 | Farnworth et al. |
| 6,621,045 B1 | 9/2003 | Liu et al. |
| 6,638,410 B2 | 10/2003 | Chen et al. |
| 6,653,236 B2 | 11/2003 | Wai et al. |
| 6,658,818 B2 | 12/2003 | Kurth et al. |
| 6,660,622 B2 | 12/2003 | Chen et al. |
| 6,660,630 B1 | 12/2003 | Chang et al. |
| 6,664,129 B2 | 12/2003 | Siniaguine |
| 6,664,485 B2 | 12/2003 | Bhatt et al. |
| 6,667,551 B2 | 12/2003 | Hanaoka et al. |
| 6,680,459 B2 | 1/2004 | Kanaya et al. |
| 6,699,787 B2 | 3/2004 | Mashino et al. |
| 6,703,310 B2 | 3/2004 | Mashino et al. |
| 6,703,689 B2 | 3/2004 | Wada |
| 6,708,405 B2 | 3/2004 | Hasler et al. |
| 6,720,661 B2 | 4/2004 | Hanaoka et al. |
| 6,734,084 B1 | 5/2004 | Nemoto et al. |
| 6,746,971 B1 | 6/2004 | Ngo et al. |
| 6,750,144 B2 | 6/2004 | Taylor |
| 6,756,564 B2 | 6/2004 | Tian |
| 6,770,958 B2 | 8/2004 | Wang et al. |
| 6,774,486 B2 | 8/2004 | Kinsman |
| 6,777,244 B2 | 8/2004 | Pepper et al. |
| 6,780,749 B2 | 8/2004 | Masumoto et al. |
| 6,790,775 B2 | 9/2004 | Fartash |
| 6,797,616 B2 | 9/2004 | Kinsman |
| 6,809,025 B2 | 10/2004 | Sandhu et al. |
| 6,809,421 B1 | 10/2004 | Hayasaka et al. |
| 6,818,464 B2 | 11/2004 | Heschel |
| 6,825,127 B2 | 11/2004 | Ouellet et al. |
| 6,825,557 B2 | 11/2004 | DiBattista et al. |
| 6,828,175 B2 | 12/2004 | Wood et al. |
| 6,828,223 B2 | 12/2004 | Chuang |
| 6,838,377 B2 | 1/2005 | Tonami et al. |
| 6,841,849 B2 | 1/2005 | Miyazawa |
| 6,847,109 B2 | 1/2005 | Shim |
| 6,852,621 B2 | 2/2005 | Hanaoka et al. |
| 6,856,023 B2 | 2/2005 | Muta et al. |
| 6,858,891 B2 | 2/2005 | Farnworth et al. |
| 6,864,172 B2 | 3/2005 | Noma et al. |
| 6,864,457 B1 | 3/2005 | Alexander et al. |
| 6,867,073 B1 | 3/2005 | Enquist |
| 6,867,390 B2 | 3/2005 | Clauer et al. |
| 6,873,054 B2 | 3/2005 | Miyazawa et al. |
| 6,882,030 B2 | 4/2005 | Siniaguine |
| 6,885,107 B2 | 4/2005 | Kinsman |
| 6,903,012 B2 | 6/2005 | Geefay et al. |
| 6,903,442 B2 | 6/2005 | Wood et al. |
| 6,903,443 B2 | 6/2005 | Farnworth et al. |
| 6,910,268 B2 | 6/2005 | Miller |
| 6,913,952 B2 | 7/2005 | Moxham et al. |
| 6,916,725 B2 | 7/2005 | Yamaguchi |
| 6,936,536 B2 | 8/2005 | Sinha |
| 6,939,343 B2 | 9/2005 | Sumiya |
| 6,943,056 B2 | 9/2005 | Nemoto |
| 6,946,325 B2 | 9/2005 | Yean et al. |
| 6,951,627 B2 | 10/2005 | Li et al. |
| 6,953,748 B2 | 10/2005 | Yamaguchi |
| 6,962,867 B2 | 11/2005 | Jackson et al. |
| 6,970,775 B2 | 11/2005 | Lederle et al. |
| 6,982,141 B2 | 1/2006 | Nogome et al. |
| 6,982,487 B2 | 1/2006 | Kim et al. |
| 7,022,609 B2 | 4/2006 | Yamamoto et al. |
| 7,023,090 B2 | 4/2006 | Huang et al. |
| 7,029,937 B2 | 4/2006 | Miyazawa |
| 7,033,927 B2 | 4/2006 | Cohen et al. |
| 7,034,401 B2 | 4/2006 | Savastiouk et al. |
| 7,037,836 B2 | 5/2006 | Lee |
| 7,039,401 B2 | 5/2006 | Eynard et al. |
| 7,041,598 B2 | 5/2006 | Sharma |
| 7,045,015 B2 | 5/2006 | Renn et al. |
| 7,049,170 B2 | 5/2006 | Savastiouk et al. |
| 7,071,031 B2 | 7/2006 | Pogge et al. |
| 7,074,703 B2 | 7/2006 | Fukazawa |
| 7,083,425 B2 | 8/2006 | Chong et al. |
| 7,084,073 B2 | 8/2006 | Lee et al. |
| 7,091,124 B2 | 8/2006 | Rigg et al. |
| 7,092,284 B2 | 8/2006 | Braun et al. |
| 7,094,677 B2 | 8/2006 | Yamamoto et al. |
| 7,109,068 B2 | 9/2006 | Akram et al. |
| 7,111,149 B2 | 9/2006 | Eilert |
| 7,129,112 B2 | 10/2006 | Matsuo |
| 7,138,710 B2 | 11/2006 | Fukazawa |
| 7,151,009 B2 | 12/2006 | Kim et al. |
| 7,164,565 B2 | 1/2007 | Takeda |
| 7,166,247 B2 | 1/2007 | Kramer |
| 7,170,183 B1 | 1/2007 | Kim et al. |
| 7,183,176 B2 | 2/2007 | Sankarapillai et al. |
| 7,183,653 B2 | 2/2007 | Myers et al. |
| 7,186,650 B1 | 3/2007 | Dakshina-Murthy |
| 7,190,061 B2 | 3/2007 | Lee |
| 7,193,308 B2 | 3/2007 | Matsui |
| 7,199,050 B2 | 4/2007 | Hiatt |
| 7,214,615 B2 * | 5/2007 | Miyazawa ............ H01L 23/481 257/E21.597 |
| 7,217,596 B2 | 5/2007 | Cobbley et al. |
| 7,217,888 B2 | 5/2007 | Sunohara et al. |
| 7,223,634 B2 | 5/2007 | Yamaguchi |
| 7,232,754 B2 | 6/2007 | Kirby et al. |
| 7,256,073 B2 | 8/2007 | Noma et al. |
| 7,262,134 B2 | 8/2007 | Kirby et al. |
| 7,262,495 B2 | 8/2007 | Chen et al. |
| 7,265,052 B2 | 9/2007 | Sinha |
| 7,271,482 B2 | 9/2007 | Kirby |
| 7,279,776 B2 | 10/2007 | Morimoto |
| 7,282,444 B2 | 10/2007 | Tanida et al. |
| 7,291,911 B2 | 11/2007 | Usami |
| 7,300,857 B2 | 11/2007 | Akram et al. |
| 7,317,256 B2 | 1/2008 | Williams et al. |
| 7,378,726 B2 | 5/2008 | Punzalan et al. |
| 7,408,265 B2 | 8/2008 | Holscher et al. |
| 7,432,582 B2 | 10/2008 | Lai et al. |
| 7,446,404 B2 | 11/2008 | Huang et al. |
| 7,449,098 B1 | 11/2008 | Mayer et al. |
| 7,491,582 B2 | 2/2009 | Yokoyama et al. |

(56) References Cited

U.S. PATENT DOCUMENTS

| | | |
|---|---|---|
| 7,498,661 B2 | 3/2009 | Matsuo |
| 7,589,009 B1 | 9/2009 | Kar-Roy et al. |
| 7,777,323 B2 | 8/2010 | Kwon et al. |
| 7,833,895 B2 | 11/2010 | Bonifield et al. |
| 7,858,429 B2 | 12/2010 | Akram et al. |
| 11,476,160 B2 * | 10/2022 | Hiatt ................ H01L 21/76898 |
| 2001/0020739 A1 | 9/2001 | Honda |
| 2002/0005583 A1 | 1/2002 | Harada et al. |
| 2002/0020898 A1 | 2/2002 | Vu et al. |
| 2002/0027293 A1 | 3/2002 | Hoshino |
| 2002/0057468 A1 | 5/2002 | Segawa et al. |
| 2002/0059722 A1 | 5/2002 | Murakami |
| 2002/0060208 A1 | 5/2002 | Liu et al. |
| 2002/0094607 A1 | 7/2002 | Gebauer et al. |
| 2002/0096729 A1 | 7/2002 | Tu et al. |
| 2002/0115290 A1 | 8/2002 | Halahan et al. |
| 2002/0130390 A1 | 9/2002 | Ker et al. |
| 2002/0190371 A1 | 12/2002 | Mashino et al. |
| 2003/0014895 A1 | 1/2003 | Lizotte |
| 2003/0042564 A1 | 3/2003 | Taniguchi et al. |
| 2003/0119308 A1 | 6/2003 | Geefay et al. |
| 2003/0148597 A1 | 8/2003 | Tan et al. |
| 2003/0173678 A1 | 9/2003 | Mizukoshi |
| 2003/0216023 A1 | 11/2003 | Wark et al. |
| 2004/0004280 A1 | 1/2004 | Shibata |
| 2004/0018712 A1 | 1/2004 | Plas et al. |
| 2004/0023447 A1 | 2/2004 | Hirakata et al. |
| 2004/0041261 A1 | 3/2004 | Kinsman |
| 2004/0043607 A1 | 3/2004 | Farnworth et al. |
| 2004/0046251 A1 | 3/2004 | Lee |
| 2004/0073607 A1 | 4/2004 | Su et al. |
| 2004/0087441 A1 | 5/2004 | Bock et al. |
| 2004/0094389 A1 | 5/2004 | Boyce |
| 2004/0137661 A1 | 7/2004 | Murayama |
| 2004/0137701 A1 | 7/2004 | Takao |
| 2004/0141536 A1 | 7/2004 | Liu et al. |
| 2004/0159668 A1 | 8/2004 | Vasiadis |
| 2004/0159958 A1 | 8/2004 | Funaki |
| 2004/0178491 A1 | 9/2004 | Akram et al. |
| 2004/0180539 A1 | 9/2004 | Yamamoto et al. |
| 2004/0188260 A1 | 9/2004 | Bonkabeta et al. |
| 2004/0192033 A1 | 9/2004 | Hara |
| 2004/0198033 A1 | 10/2004 | Lee et al. |
| 2004/0198040 A1 | 10/2004 | Geefay et al. |
| 2004/0219342 A1 | 11/2004 | Boggs et al. |
| 2004/0219763 A1 | 11/2004 | Kim et al. |
| 2004/0222082 A1 | 11/2004 | Gopalraja et al. |
| 2004/0245623 A1 | 12/2004 | Hara et al. |
| 2004/0245649 A1 | 12/2004 | Imaoka |
| 2004/0255258 A1 | 12/2004 | Li |
| 2004/0262753 A1 | 12/2004 | Kashiwazaki |
| 2004/0265562 A1 | 12/2004 | Uzoh et al. |
| 2005/0026443 A1 | 2/2005 | Goo et al. |
| 2005/0037608 A1 | 2/2005 | Andricacos et al. |
| 2005/0046002 A1 | 3/2005 | Lee et al. |
| 2005/0064707 A1 | 3/2005 | Sinha |
| 2005/0067620 A1 | 3/2005 | Chan et al. |
| 2005/0069782 A1 | 3/2005 | Elenius et al. |
| 2005/0101054 A1 | 5/2005 | Mastromatteo et al. |
| 2005/0101116 A1 | 5/2005 | Tseng |
| 2005/0104228 A1 | 5/2005 | Rigg et al. |
| 2005/0106834 A1 | 5/2005 | Andry et al. |
| 2005/0110095 A1 | 5/2005 | Shih et al. |
| 2005/0110889 A1 | 5/2005 | Tuttle et al. |
| 2005/0127478 A1 | 6/2005 | Hiatt et al. |
| 2005/0136646 A1 | 6/2005 | Lauffer et al. |
| 2005/0139390 A1 | 6/2005 | Kim et al. |
| 2005/0150683 A1 | 7/2005 | Farnworth et al. |
| 2005/0151228 A1 | 7/2005 | Tanida et al. |
| 2005/0164500 A1 | 7/2005 | Lindgren |
| 2005/0179120 A1 | 8/2005 | Yamaguchi |
| 2005/0184219 A1 | 8/2005 | Kirby |
| 2005/0189637 A1 | 9/2005 | Okayama et al. |
| 2005/0191861 A1 | 9/2005 | Verhaverbeke |
| 2005/0194169 A1 | 9/2005 | Tonomura |
| 2005/0208766 A1 | 9/2005 | Kirby et al. |
| 2005/0218497 A1 | 10/2005 | Komuro |
| 2005/0227382 A1 | 10/2005 | Hui |
| 2005/0230805 A1 | 10/2005 | Miyazawa |
| 2005/0231626 A1 | 10/2005 | Tuttle et al. |
| 2005/0236708 A1 | 10/2005 | Farnworth et al. |
| 2005/0247894 A1 | 11/2005 | Watkins et al. |
| 2005/0253213 A1 | 11/2005 | Jiang et al. |
| 2005/0254133 A1 | 11/2005 | Akram et al. |
| 2005/0258530 A1 | 11/2005 | Vindasius et al. |
| 2005/0272221 A1 | 12/2005 | Yen et al. |
| 2005/0275048 A1 | 12/2005 | Farnworth et al. |
| 2005/0275049 A1 | 12/2005 | Kirby et al. |
| 2005/0275051 A1 | 12/2005 | Farnworth et al. |
| 2005/0275750 A1 | 12/2005 | Akram et al. |
| 2005/0277293 A1 | 12/2005 | Kim et al. |
| 2005/0282374 A1 | 12/2005 | Hwang et al. |
| 2005/0285154 A1 | 12/2005 | Akram et al. |
| 2006/0003566 A1 | 1/2006 | Emesh |
| 2006/0011809 A1 | 1/2006 | Farnworth et al. |
| 2006/0014313 A1 | 1/2006 | Hall et al. |
| 2006/0023107 A1 | 2/2006 | Bolken et al. |
| 2006/0024856 A1 | 2/2006 | Derderian et al. |
| 2006/0035402 A1 | 2/2006 | Street et al. |
| 2006/0035415 A1 | 2/2006 | Wood et al. |
| 2006/0038183 A1 | 2/2006 | Oliver |
| 2006/0038272 A1 | 2/2006 | Edwards |
| 2006/0040421 A1 | 2/2006 | Farnworth et al. |
| 2006/0040428 A1 | 2/2006 | Johnson |
| 2006/0042952 A1 | 3/2006 | Oliver et al. |
| 2006/0043262 A1 | 3/2006 | Akram |
| 2006/0043509 A1 | 3/2006 | Watkins et al. |
| 2006/0043512 A1 | 3/2006 | Oliver et al. |
| 2006/0043569 A1 | 3/2006 | Benson et al. |
| 2006/0043599 A1 | 3/2006 | Akram et al. |
| 2006/0044433 A1 | 3/2006 | Akram |
| 2006/0046332 A1 | 3/2006 | Derderian et al. |
| 2006/0046438 A1 | 3/2006 | Kirby |
| 2006/0046468 A1 | 3/2006 | Akram et al. |
| 2006/0046471 A1 | 3/2006 | Kirby et al. |
| 2006/0046537 A1 | 3/2006 | Chong et al. |
| 2006/0057776 A1 | 3/2006 | Tao |
| 2006/0057836 A1 | 3/2006 | Nagarajan et al. |
| 2006/0071347 A1 | 4/2006 | Potta |
| 2006/0084258 A1 | 4/2006 | Nemoto et al. |
| 2006/0148250 A1 | 7/2006 | Kirby |
| 2006/0151880 A1 | 7/2006 | Tang et al. |
| 2006/0154153 A1 | 7/2006 | Chiang et al. |
| 2006/0160367 A1 | 7/2006 | Wai et al. |
| 2006/0177959 A1 | 8/2006 | Boettiger et al. |
| 2006/0177999 A1 | 8/2006 | Hembree et al. |
| 2006/0180941 A1 | 8/2006 | Kirby et al. |
| 2006/0186097 A1 | 8/2006 | Watkins et al. |
| 2006/0186492 A1 | 8/2006 | Boettiger et al. |
| 2006/0191882 A1 | 8/2006 | Watkins et al. |
| 2006/0195729 A1 | 8/2006 | Huppenthal et al. |
| 2006/0199363 A1 | 9/2006 | Kirby et al. |
| 2006/0204651 A1 | 9/2006 | Wai et al. |
| 2006/0208360 A1 | 9/2006 | Yiu et al. |
| 2006/0216862 A1 | 9/2006 | Rigg et al. |
| 2006/0223301 A1 | 10/2006 | Vanhaelemeersch et al. |
| 2006/0240687 A1 | 10/2006 | Chong et al. |
| 2006/0249849 A1 | 11/2006 | Cohen |
| 2006/0252254 A1 | 11/2006 | Basol |
| 2006/0252262 A1 | 11/2006 | Kazemi |
| 2006/0255443 A1 | 11/2006 | Hwang et al. |
| 2006/0264041 A1 | 11/2006 | Rigg et al. |
| 2006/0270108 A1 | 11/2006 | Farnworth et al. |
| 2006/0278979 A1 | 12/2006 | Rangel |
| 2006/0278980 A1 | 12/2006 | Trezza et al. |
| 2006/0278988 A1 | 12/2006 | Trezza et al. |
| 2006/0278989 A1 | 12/2006 | Trezza |
| 2006/0278994 A1 | 12/2006 | Trezza |
| 2006/0278995 A1 | 12/2006 | Trezza |
| 2006/0281224 A1 | 12/2006 | Edelstein et al. |
| 2006/0281243 A1 | 12/2006 | Trezza |
| 2006/0289967 A1 | 12/2006 | Heck et al. |
| 2006/0289968 A1 | 12/2006 | Sulfridge |
| 2006/0290001 A1 | 12/2006 | Sulfridge |

(56) References Cited

U.S. PATENT DOCUMENTS

| | | |
|---|---|---|
| 2006/0292877 A1 | 12/2006 | Lake |
| 2007/0004079 A1 | 1/2007 | Geefay et al. |
| 2007/0012655 A1 | 1/2007 | Kwon et al. |
| 2007/0020805 A1 | 1/2007 | Kim et al. |
| 2007/0020935 A1 | 1/2007 | Taylor et al. |
| 2007/0023121 A1 | 2/2007 | Jones et al. |
| 2007/0032061 A1 | 2/2007 | Farnworth et al. |
| 2007/0035033 A1 | 2/2007 | Ozguz et al. |
| 2007/0037379 A1 | 2/2007 | Enquist et al. |
| 2007/0042598 A1 | 2/2007 | Park |
| 2007/0045120 A1 | 3/2007 | Tiwari et al. |
| 2007/0045388 A1 | 3/2007 | Farnworth et al. |
| 2007/0045515 A1 | 3/2007 | Farnworth et al. |
| 2007/0045632 A1 | 3/2007 | Oliver et al. |
| 2007/0045779 A1 | 3/2007 | Hiatt |
| 2007/0045806 A1 | 3/2007 | Hsuan |
| 2007/0045812 A1 | 3/2007 | Heng |
| 2007/0045826 A1 | 3/2007 | Lee et al. |
| 2007/0045834 A1 | 3/2007 | Chong et al. |
| 2007/0048896 A1 | 3/2007 | Andry et al. |
| 2007/0048994 A1 | 3/2007 | Tuttle |
| 2007/0049016 A1 | 3/2007 | Hiatt et al. |
| 2007/0049019 A1 | 3/2007 | Wai et al. |
| 2007/0057028 A1 | 3/2007 | Lake et al. |
| 2007/0077753 A1 | 4/2007 | Iwatake et al. |
| 2007/0082427 A1 | 4/2007 | Shirahama et al. |
| 2007/0096263 A1 | 5/2007 | Furukawa et al. |
| 2007/0099395 A1 | 5/2007 | Sridhar et al. |
| 2007/0111386 A1 | 5/2007 | Kim et al. |
| 2007/0122940 A1 | 5/2007 | Gautham |
| 2007/0138562 A1 | 6/2007 | Trezza |
| 2007/0145563 A1 | 6/2007 | Punzalan et al. |
| 2007/0152342 A1 | 7/2007 | Tsao et al. |
| 2007/0155997 A1 | 7/2007 | Li et al. |
| 2007/0158839 A1 | 7/2007 | Trezza |
| 2007/0158853 A1 | 7/2007 | Sinha |
| 2007/0161235 A1 | 7/2007 | Trezza |
| 2007/0166991 A1 | 7/2007 | Sinha |
| 2007/0166997 A1 | 7/2007 | Knorr |
| 2007/0167004 A1 | 7/2007 | Trezza |
| 2007/0170574 A1 | 7/2007 | Lauxtermann et al. |
| 2007/0178694 A1 | 8/2007 | Hiatt |
| 2007/0182020 A1 | 8/2007 | Trezza et al. |
| 2007/0190803 A1 | 8/2007 | Singh et al. |
| 2007/0197013 A1 | 8/2007 | Trezza |
| 2007/0202617 A1 | 8/2007 | Hembree |
| 2007/0222050 A1 | 9/2007 | Lee et al. |
| 2007/0222054 A1 | 9/2007 | Hembree |
| 2007/0228576 A1 | 10/2007 | Trezza |
| 2007/0228926 A1 | 10/2007 | Teo et al. |
| 2007/0262424 A1 | 11/2007 | Hiatt |
| 2007/0267138 A1 | 11/2007 | White et al. |
| 2007/0281473 A1 | 12/2007 | Clark et al. |
| 2007/0293040 A1 | 12/2007 | Emesh et al. |
| 2008/0006850 A1 | 1/2008 | Ribnicek et al. |
| 2008/0050904 A1 | 2/2008 | Lake |
| 2008/0050911 A1 | 2/2008 | Borthakur |
| 2008/0054444 A1 | 3/2008 | Tuttle |
| 2008/0057620 A1 | 3/2008 | Pratt |
| 2008/0079120 A1 | 4/2008 | Foster et al. |
| 2008/0079121 A1 | 4/2008 | Han |
| 2008/0081386 A1 | 4/2008 | Raravikar et al. |
| 2008/0081398 A1 | 4/2008 | Lee et al. |
| 2008/0265933 A1 | 10/2008 | Tanioka et al. |
| 2008/0299759 A1 | 12/2008 | Chatterjee et al. |
| 2008/0299762 A1 | 12/2008 | Mathew et al. |
| 2008/0318361 A1 | 12/2008 | Han et al. |
| 2009/0007934 A1 | 1/2009 | Hutto |
| 2009/0014859 A1 | 1/2009 | Jeung et al. |
| 2009/0057912 A1 | 3/2009 | Kheng |
| 2009/0091962 A1 | 4/2009 | Chung et al. |
| 2009/0127668 A1 | 5/2009 | Choi |
| 2009/0146312 A1 | 6/2009 | Sulfridge |
| 2009/0166846 A1 | 7/2009 | Pratt et al. |
| 2009/0180257 A1 | 7/2009 | Lee et al. |
| 2009/0224405 A1 | 9/2009 | Chiou et al. |
| 2009/0283898 A1 | 11/2009 | Janzen et al. |
| 2009/0315154 A1 | 12/2009 | Kirby et al. |
| 2009/0321947 A1 | 12/2009 | Pratt |
| 2010/0038778 A1* | 2/2010 | Lee .................. H01L 25/50 |
| | | 257/E23.079 |
| 2010/0038800 A1 | 2/2010 | Yoon et al. |
| 2010/0090317 A1 | 4/2010 | Zimmermann et al. |
| 2010/0330749 A1 | 12/2010 | Jeung et al. |
| 2011/0019372 A1 | 1/2011 | Teck Kheng |
| 2011/0042819 A1 | 2/2011 | Wen et al. |
| 2011/0056740 A1 | 3/2011 | Takano |
| 2011/0079900 A1 | 4/2011 | Hiatt et al. |
| 2011/0133302 A1 | 6/2011 | Sulfridge |
| 2011/0156268 A1 | 6/2011 | Cheng |
| 2011/0291268 A1 | 12/2011 | Wang et al. |
| 2012/0094443 A1 | 4/2012 | Pratt et al. |
| 2012/0270405 A1 | 10/2012 | Hutto |
| 2013/0147036 A1 | 6/2013 | Choi et al. |
| 2014/0048937 A1 | 2/2014 | Bae |
| 2021/0005514 A1 | 1/2021 | Hiatt et al. |

FOREIGN PATENT DOCUMENTS

| | | |
|---|---|---|
| EP | 1154474 A1 | 11/2001 |
| EP | 1415950 A2 | 5/2004 |
| JP | 63052432 A | 3/1988 |
| JP | 1252308 A | 10/1989 |
| JP | 02235589 A | 9/1990 |
| JP | 05104316 A | 4/1993 |
| JP | 2001097496 A | 3/2001 |
| JP | 2001082931 A | 3/2001 |
| JP | 2001298147 A | 10/2001 |
| JP | 2002018585 A | 1/2002 |
| JP | 2005093980 A | 4/2005 |
| JP | 2005310817 A | 11/2005 |
| KR | 20010018694 A | 3/2001 |
| KR | 20020022122 A | 3/2002 |
| KR | 20020061812 A | 7/2002 |
| TW | 250597 B | 7/1995 |
| WO | 2004109770 A2 | 12/2004 |
| WO | 2005022965 A2 | 3/2005 |
| WO | 2005036940 A1 | 4/2005 |
| WO | 2006053036 A2 | 5/2006 |
| WO | 2006124597 A2 | 11/2006 |
| WO | 2007025812 A1 | 3/2007 |
| WO | 2007043718 A1 | 4/2007 |

OTHER PUBLICATIONS

"Aachboun, S. and P. Ranson, "Deep anisotropic etching of silicon," J. Vac. Sci. Technol. A 17(4), Jul./Aug. 1999, pp. 2270-2273."

"Amazawa, T. et al., "Planarized Multilevel Interconnection Using Chemical Mechanical Polishing of Selective CVD-Al Via Plugs," IEEE Transactions on Electron Devices, vol. 45, No. 4, pp. 815-820, Apr. 1998."

"Armacost, M. et al., "Plasma-Etching Processes for ULSI Semiconductor Circuits," IBM J. Res. Develop., vol. 43, No. 1/2, pp. 39-72, Jan./Mar. 1999, <http://www.research.ibm.com/journal/rd/431/armacost.pdf>."

"Arunasalam, P. et al., "Thermo-Mechanical Analysis of Thru-Silicon-Via Based High Density Compliant Interconnect," Electronic Components and Technology Conference, 2007, ECTC '07, Proceedings, 57th, May 29, 2007-Jun. 1, 2007, pp. 1179-1185."

"Bernstein, K. et al., "Interconnects in the Third Dimension: Design Challenges for 3D ICs," Design Automation Conference, 2007, DAC '07, 44th ACM/IEEE, Jun. 4-8, 2007, pp. 562-567."

"Blackburn, J.M. et al., "Deposition of Conformal Copper and Nickel Films from Supercritical Carbon Dioxide," Science, vol. 94, Oct. 2001, pp. 141-145."

"Cheung, T.S.D. et al., "On-Chip Interconnect for mm-Wave Applications Using an All-Copper Technology and Wavelength Reduction," 2003 IEEE International Solid-State Circuits Conference."

"Chou, Bill et al., "Ultra Via Substrate for Advanced BGA Applications," Pan Pacific Symposium, Jan. 25, 2000, <http://www.smta.org/files/PanPac00-ChouBill.pdf>."

(56) References Cited

OTHER PUBLICATIONS

"De Boer, M.J. et al., "Micromachining of Buried Micro Channels in Silicon," Journal of Microelectromechanical Systems, vol. 9, No. 1, Mar. 2000, IEEE, ISSN: 1057-7157."

"Gutmann, R.J., "Wafer-Level Three-Dimensional Monolithic Integration for Heterogeneous Silicon ICs," 2004 Topical Meeting on Silicon Monolithic Integrated Circuits in RF Systems, IEEE, Sep. 8-10, 2004, pp. 45-48."

"Hirafune, S. et al., "Packaging Technology for Imager Using Through-hole Interconnection in Si Substrate," Proceeding of HDP'04, IEEE, pp. 303-306, Jul. 2004."

"Jang, D.M. et al., "Development and Evaluation of 3-D SiP with Vertically Interconnected Through Silicon Vias (TSV)," Proceedings of the 57th Electronic Components and Technology Conference, IEEE, May 29, 2007-Jun. 1, 2007, pp. 847-852, ISBN: 1-4244-0985-3"."

"Kada, M. et al., "Advancements in Stacked Chip Scale Packaging (S-CSP) Provides System-in-a-Package Functionality for Wireless and Handheld Applications," Future Fab Intl., vol. 9, Jan. 7, 2000."

"Keigler, A. et al., "Enabling 3-D Design," Semiconductor International, Aug. 2007."

"Kim, J.Y. et al., "S-RCAT (Sphere-shaped-Recess-Channel-Array Transistor) Technology for 70nm DRAM Feature Size and Beyond," 2005 Symposium on VLSI Technology, Digest of Technical Papers, Jun. 14-16, 2005, pp. 34-35, IEEE, ISBN: 4-900784-02-8."

"Kuhn, Markus and Jose A. Rodriguez, "Adsorption of sulfur on bimetallic surfaces: Formation of copper sulfides on Pt(111) and Ru(001)," J. Vac. Sci. Technol. A 13(3), pp. 1569-1573, May/Jun. 1995."

"Kurita, Y. et al., "A 3D Stacked Memory Integrated on a Logic Device Using SMAFTI Technology," 2007 IEEE Electronic Components and Technology Conference, pp. 821-829, May 29-Jun. 1, 2007, ISBN 1-4244-0985-3."

"Kyocera Corporation, Memory Package, 1 page, retrieved from the Internet on Dec. 3, 2004, <http://global.kyocera.com/prdct/semicon/ic_pkg/memory_p.html>."

"Lee, H.M. et al., Abstract of "Abatement of Sulfur Hexaflouride Emissions from the Semiconductor Manufacturing Process by Atmospheric-Pressure Plasmas," 1 page, Aug. 2004, <http:www.awma.org/journal/ShowAbstract.asp?Year=&PaperID=1256>."

"Lee, Rex A. et al., "Laser Created Silicon Vias for Stacking Dies in MCMs," IEEE/CHMT IEMT Symposium, 1991, pp. 262-265."

"Lee, T.K. et al., "A Novel Joint-in-Via Flip-Chip Chip-Scale Package," IEEE Transactions on Advanced Packaging, vol. 29, No. 1, pp. 186-194, Feb. 2006."

"Moffat, T.P., et al. "Superconformal film growth; Mechanism and quantification," IBM J. Res. & Dev., vol. 49, No. 1, pp. 19-36, Jan. 2005."

"Morrow, P.R. et al., "Three-Dimensional Wafer Stacking Via Cu—Cu Bonding Integrated With 65-nm Strained-Si/Low-k CMOS Technology," IEEE Electron Device Letters, vol. 27, No. 5, pp. 335-337, May 2006, ISBN: 0741-3106."

"Pienimaa, S.K. et al., "Stacked Thin Dice Package," Proceedings of the 51st Electronic Components and Technology Conference, 2001, pp. 361-366, IEEE."

"Rasmussen, F.E., et al., "Fabrication of High Aspect Ratio Through-Wafer Vias in CMOS Wafers for 3-D Packaging Applications," The 12th International Conference on Solid State Sensors, Actuators and Microsystems, Boston, Jun. 8-12, 2003."

"Savastiouk, S. et al., "Thru-silicon interconnect technology," 26th IEEE/CPMT International Electronics Manufacturing Technology Symposium, 2000, abstract."

"Schaper, L. et al., "Integrated System Development for 3-D VLSI," Electronic Components and Technology Conference, 2007, ECTC '07, Proceedings, 57th, May 29, 2007-Jun. 1, 2007, pp. 853-857."

"Solberg, V., "Innovative 3-D Solutions for Multiple Die Packaging," SMTA International Conference, Sep. 21, 2003."

"Takahashi, K. et al., "Current Status of Research and Development for Three-Dimensional Chip Stack Technology," Jpn. J. Appl. Phys., vol. 40 (2001), pp. 3032-3037, Part 1, No. 4B, Apr. 30, 2001, abstract."

"Takahashi, K. et al., "Through Silicon Via and 3-D Wafer/Chip Stacking Technology," 2006 Symposium on VLSI Circuits Digest of Technical Papers."

"Takizawa, T. et al., "Conductive Interconnections Through Thick Silicon Substrates for 3D Packaging," The Fifteenth International Conference on Micro Electro Mechanical Systems, Las Vegas, Jan. 20-24, 2002."

"Tezcan, D.S. et al., "Sloped Through Wafer Vias for 3D Wafer Level Packaging," Electronic Components and Technology Conference, 2007, ECTC '07, Proceedings, 57th, May 29, 2007-Jun. 1, 2007, pp. 643-647."

"Thomas, D.J. et al., "Etching of Vias and Trenches Through Low k Dielectrics with Feature Sizes Down to 0.1 mm Using M0RIÖ High Density Plasmas," presented at the 197th Meeting of the Electrochemical Society, Toronto 2000, <http://www.trikon.com/pdfs/ECS2b>".

"Trigas, C., "System-in-Package or System-on-Chip?," EE Times, Sep. 19, 2003, <http://www.eetimes.com/story/OEG20030919S0049>."

"Vereecken, P.M. et al., "The chemistry of additives in damascene copper plating," IBM J. Res. & Dev., vol. 49, No. 1, pp. 3-18, Jan. 2005."

"Xsil, Via Applications, 1 page, <http://www.xsil.com/viaapplications/index.htm>, retrieved from the Internet on Jul. 22, 2003."

"Xsil, Vias for 3D Packaging, 1 page, <http://www.xsil.com/viaapplications/3dpackaging/index.htm>, retrieved from the Internet on Jul. 22, 2003."

"XSiL, xise200 for vias and micro-machining, <http://www.xsil.com/products/index/html>, retrieved from the Internet on Aug. 16, 2003".

"Yamamoto, S. et al., "Si Through-Hole Interconnections Filled with Au—Sn Solder by Molten Metal Suction Method," pp. 642-645, IEEE, MEMS-03 Kyoto, The Sixteenth Annual International Conference on Micro Electro Mechanical Systems, Jan. 2003, ISBN 0-7803-"."

\* cited by examiner

MICROFEATURE WORKPIECES AND METHODS FOR FORMING INTERCONNECTS IN MICROFEATURE WORKPIECES

CROSS-REFERENCE TO RELATED APPLICATIONS

This application is a continuation of U.S. application Ser. No. 16/991,965 filed Aug. 12, 2020, which is a continuation of U.S. application Ser. No. 15/662,204 filed Jul. 27, 2017, which is a divisional of U.S. application Ser. No. 12/965,301 filed Dec. 10, 2010, which is a divisional of U.S. application Ser. No. 11/217,169 filed Sep. 1, 2005, now U.S. Pat. No. 7,863,187, each of which is incorporated herein by reference in its entirety.

TECHNICAL FIELD

The present invention relates to methods for forming interconnects in microfeature workpieces and microfeature workpieces formed using such methods.

BACKGROUND

Microelectronic devices, micromechanical devices, and other devices with microfeatures are typically formed by constructing several layers of components on a workpiece. In the case of microelectronic devices, a plurality of dies are fabricated on a single workpiece, and each die generally includes an integrated circuit and a plurality of bond-pads coupled to the integrated circuit. The dies are separated from each other and packaged to form individual microelectronic devices that can be attached to modules or installed in other products.

One aspect of fabricating and packaging such dies is forming interconnects that electrically couple conductive components located in different layers. In some applications, it may be desirable to form interconnects that extend completely through the dies or through a significant portion of the dies. Such interconnects electrically couple bond-pads or other conductive elements proximate to one side of the dies to conductive elements proximate to the other side of the dies. Through-wafer interconnects, for example, are constructed by forming deep vias on the front side and/or backside of the workpiece and in alignment with corresponding bond-pads at the front side of the workpiece. The vias are often blind vias in that they are closed at one end. The blind vias are then filled with a conductive fill material. After further processing, the workpiece is thinned to reduce the thickness of the final dies. Solder balls or other external electrical contacts are subsequently attached to the through-wafer interconnects at the backside and/or the front side of the workpiece. The solder balls or external contacts can be attached either before or after singulating the dies from the workpiece.

Conventional processes for forming external contacts on through-wafer interconnects include (a) depositing a dielectric layer on the backside of the workpiece, (b) forming a photoresist on the dielectric layer, (c) patterning and developing the photoresist, (d) etching the dielectric layer to form holes aligned with corresponding interconnects, (e) removing the photoresist from the workpiece, and (f) forming conductive external contacts in the holes in the dielectric layer. One concern with forming external contacts on the backside of a workpiece is that conventional processes are relatively expensive because patterning the photoresist requires a mask. Masks are expensive and time-consuming to construct because they require very expensive photolithography equipment to achieve the tolerances required in semiconductor devices. Accordingly, there is a need to reduce the cost of forming external contacts on workpieces with through-wafer interconnects.

BRIEF DESCRIPTION OF THE DRAWINGS

FIG. 1A is a schematic side cross-sectional view of a portion of the workpiece at an intermediate stage after partially forming a plurality of interconnects.

FIG. 1B is a schematic side cross-sectional view of the area 1B shown in FIG. 1A with the workpiece flipped over.

FIG. 1C is a schematic side cross-sectional view of the portion of the workpiece after thinning the substrate from the second side.

FIG. 1D is a schematic side cross-sectional view of the portion of the workpiece after selectively removing additional material from the second side of the substrate so that the interconnect projects from the substrate.

FIG. 1E is a schematic side cross-sectional view of the area 1E shown in FIG. 1D after forming a recess in the second end portion of the interconnect.

FIG. 1F is a schematic side cross-sectional view of the portion of the workpiece after forming a dielectric structure across the second side of the substrate and the second end portion of the interconnect.

FIG. 1G is a schematic side cross-sectional view of the portion of the workpiece after removing sections of the interconnect and the dielectric structure.

FIG. 1H is a schematic side cross-sectional view of the portion of the workpiece after removing the section of the first dielectric layer from the recess in the interconnect.

FIG. 1I is a schematic side cross-sectional view of the portion of the workpiece after forming a conductive member at the second end portion of the interconnect.

FIG. 2A is a schematic side cross-sectional view of a portion of the workpiece at an intermediate stage after partially forming an interconnect.

FIG. 2B is a schematic side cross-sectional view of the portion of the workpiece after removing sections of the interconnect and the dielectric structure.

FIG. 2C is a schematic side cross-sectional view of the portion of the workpiece after forming the conductive member on the exposed surface of the interconnect.

FIG. 3A is a schematic side cross-sectional view of a portion of the workpiece at an intermediate stage after partially forming an interconnect.

FIG. 3B is a schematic side cross-sectional view of the portion of the workpiece after removing sections of the interconnect and the dielectric structure.

FIG. 3C is a schematic side cross-sectional view of the workpiece after forming a conductive member on the exposed surface of the interconnect.

DETAILED DESCRIPTION

A. Overview

Figure 1A:
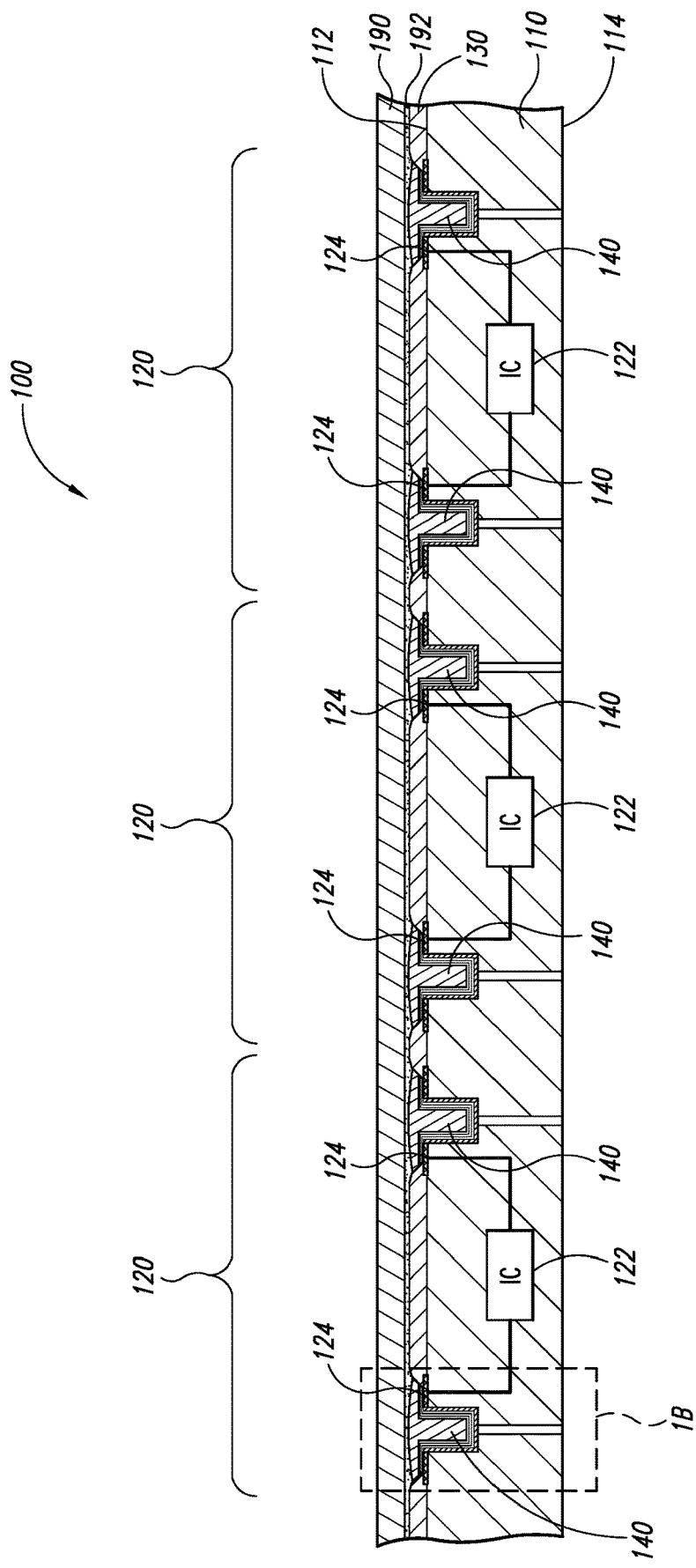
FIGS. 1A-1I illustrate stages of a method for forming interconnects in a microfeature workpiece in accordance with one embodiment of the invention.

The following disclosure describes several embodiments of methods for forming interconnects in microfeature workpieces, and microfeature workpieces having such interconnects. One aspect of the invention is directed to methods of forming an interconnect in a microfeature workpiece having a terminal and a substrate with a first side carrying the terminal and a second side opposite the first side. An embodiment of one such method includes (a) constructing an electrically conductive interconnect extending from the terminal to at least an intermediate depth in the substrate, and (b) removing material from the second side of the substrate so that a portion of the interconnect projects from the substrate. The material can be removed from the second side of the substrate by thinning the substrate so that a surface of the interconnect is exposed and selectively etching the substrate so that the portion of the interconnect projects from the substrate.

In another embodiment, a method includes providing a microfeature workpiece having (a) a substrate with a first side and a second side opposite the first side, (b) a terminal carried by the first side of the substrate, and (c) an electrically conductive interconnect extending from the terminal through the substrate and projecting from the second side of the substrate. The method further includes applying a dielectric layer to the second side of the substrate and the portion of the interconnect projecting from the second side of the substrate, and removing a section of the dielectric layer to expose a surface of the interconnect with the interconnect intersecting a plane defined by the remaining section of the dielectric layer.

In another embodiment, a method includes forming an electrically conductive interconnect having a first portion at the terminal and a second portion at an intermediate depth in the substrate. The electrically conductive interconnect is electrically connected to the terminal. The method further includes thinning the substrate from the second side to at least the second portion of the interconnect, applying a dielectric layer to the second side of the substrate and the second portion of the interconnect, and exposing a surface of the second portion of the interconnect without photolithography.

Another aspect of the invention is directed to microfeature workpieces. In one embodiment, a microfeature workpiece includes a substrate and a microelectronic die formed in and/or on the substrate. The substrate has a first side and a second side opposite the first side. The die includes a terminal at the first side of the substrate and an integrated circuit operably coupled to the terminal. The workpiece further includes an electrically conductive interconnect extending from the terminal through the substrate such that a portion of the interconnect projects from the second side of the substrate. The interconnect is electrically coupled to the terminal.

In another embodiment, a microfeature workpiece includes a substrate and a microelectronic die formed in and/or on the substrate. The substrate has a first side and a second side opposite the first side. The die includes a terminal at the first side of the substrate and an integrated circuit operably coupled to the terminal. The workpiece further includes (a) a hole extending through the terminal and the substrate, (b) a dielectric layer on the second side of the substrate defining a plane, and (c) an electrically conductive interconnect. The interconnect includes a conductive fill material in the hole and a conductive layer in the hole between the conductive fill material and the substrate. Both the conductive fill material and the conductive layer are electrically coupled to the terminal and extend from the terminal through the substrate. Moreover, both the conductive fill material and the conductive layer project from the substrate such that the conductive fill material and the conductive layer intersect the plane.

Specific details of several embodiments of the invention are described below with reference to interconnects extending from a terminal proximate to the front side of a workpiece, but the methods and interconnects described below can be used for other types of interconnects within microelectronic workpieces. Several details describing well-known structures or processes often associated with fabricating microelectronic devices are not set forth in the following description for purposes of clarity. Also, several other embodiments of the invention can have different configurations, components, or procedures than those described in this section. A person of ordinary skill in the art, therefore, will accordingly understand that the invention may have other embodiments with additional elements, or the invention may have other embodiments without several of the elements shown and described below with reference to FIGS. 1A-3C.

The term "microfeature workpiece" is used throughout to include substrates upon which and/or in which microelectronic devices, micromechanical devices, data storage elements, optics, and other features are fabricated. For example, microfeature workpieces can be semiconductor wafers, glass substrates, dielectric substrates, or many other types of substrates. Many features on such microfeature workpieces have critical dimensions less than or equal to 1 µm, and in many applications the critical dimensions of the smaller features are less than 0.25 µm or even less than 0.1 µm. Where the context permits, singular or plural terms may also include the plural or singular term, respectively. Moreover, unless the word "or" is expressly limited to mean only a single item exclusive from other items in reference to a list of at least two items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same features and/or types of other features and components are not precluded.

B. Embodiments of Methods for Forming Interconnects in Microfeature Workpieces FIGS. 1A-1I illustrate stages of a method for forming interconnects in a microfeature workpiece 100 in accordance with one embodiment of the invention. FIG. 1A, for example, is a schematic side cross-sectional view of a portion of the workpiece 100 at an intermediate stage after partially forming a plurality of interconnects 140. The workpiece 100 can include a substrate 110 and a plurality of microelectronic dies 120 formed in and/or on the substrate 110. The substrate 110 has a first side 112 and a second side 114 opposite the first side 112. The substrate 110 is generally a semiconductor wafer, and the dies 120 are arranged in a die pattern on the wafer. The individual dies 120 include integrated circuitry 122 (shown schematically) and a plurality of terminals 124 (e.g., bond-pads) electrically coupled to the integrated circuitry 122. The terminals 124 shown in FIG. 1A are external features at the first side 112 of the substrate 110. In other embodiments, however, the terminals 124 can be internal features that are embedded at an intermediate depth within the substrate 110. Moreover, in additional embodiments, the dies 120 can have different features to perform different functions. For example, the individual dies may further include an image sensor (e.g., CMOS image sensor or CCD image sensor) for capturing pictures or other images in the visible spectrum, or detecting radiation in other spectrums (e.g., IR or UV ranges).

In previous processing steps, a first dielectric layer 130 was applied to the first side 112 of the substrate 110, and the interconnects 140 were partially formed in the workpiece 100. The first dielectric layer 130 can be a polyimide material or other suitable nonconductive materials. For example, the first dielectric layer 130 can be parylene, a low temperature chemical vapor deposition (low temperature CVD) material such as silicon nitride ($Si_3N_4$), silicon oxide ($SiO_2$), and/or other suitable materials. The foregoing list of dielectric materials is not exhaustive. The conductive interconnects 140 extend from the first dielectric layer 130 to an intermediate depth in the substrate 110. As described in greater detail below with regard to FIG. 1B, the conductive interconnects 140 can include several layers of conductive material that are electrically coupled to corresponding terminals 124. Suitable methods for forming the portion of the interconnects 140 illustrated in FIG. 1A are disclosed in U.S. patent application Ser. Nos. 10/713,878; 10/867,352; 10/879,398; 11/027,443; 11/056,211; 11/169,546; 11/217,877; and 11/218,243, which are incorporated herein by reference. After partially forming the interconnects 140, the workpiece 100 can optionally be attached to a support member 190 with an adhesive 192 to provide rigidity to the workpiece 100 during subsequent processing steps.

Figure 1B:
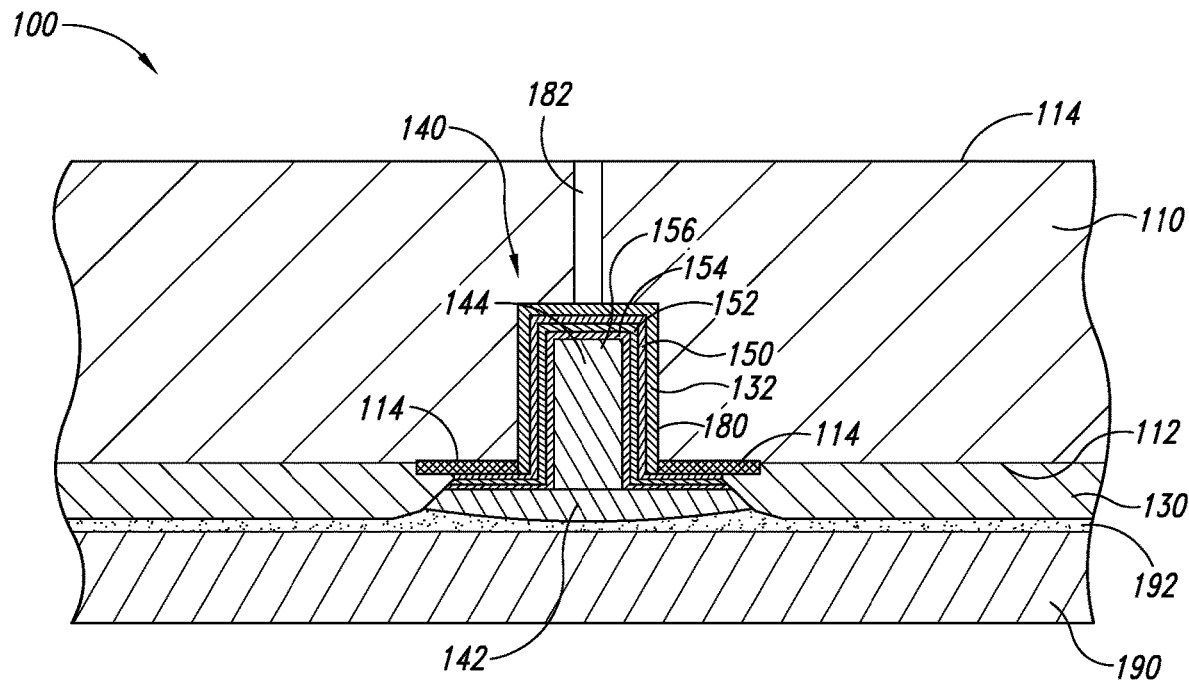

FIG. 1B is a schematic side cross-sectional view of the area 1B shown in FIG. 1A with the workpiece 100 flipped over. The workpiece 100 includes an interconnect hole 180 extending from the terminal 114 to an intermediate depth in the substrate 110, a second dielectric layer 132 in the interconnect hole 180, and a vent hole 182 extending from the interconnect hole 180 to the second side 114 of the substrate 110. The second dielectric layer 132 electrically insulates components in the substrate 110 from the interconnect 140. The second dielectric layer 132 can be an ALD (atomic layer deposition) aluminum oxide material applied using a suitable deposition process or another suitable low temperature CVD oxide. In another embodiment, the second dielectric layer 132 can include a silane-based and/or an aluminum-based oxide material. In still further embodiments, the second dielectric layer 132 can include other suitable dielectric materials.

The illustrated interconnect 140 is formed in the interconnect hole 180 and has a first end portion 142 at the first dielectric layer 130 and a second end portion 144 at an intermediate depth in the substrate 110. The illustrated interconnect 140 includes a diffusion barrier layer 150 deposited over the second dielectric layer 132 in the hole 180, a seed layer 152 formed over the barrier layer 150 in the hole 180, a conductive layer 154 deposited over the seed layer 152 in the hole 180, and a conductive fill material 152 formed over the conductive layer 154 in the hole 180. The diffusion barrier layer 150 can be a layer of tantalum that is deposited onto the workpiece 100 using physical vapor deposition (PVD) and has a thickness of approximately 150 Angstroms. In other embodiments, the barrier layer 150 may be deposited onto the workpiece 100 using other vapor deposition processes, such as CVD, and/or may have a different thickness. In either case, the barrier layer 150 is not limited to tantalum, but rather may be composed of tungsten or other suitable materials that help contain the conductive fill material 156 in the interconnect hole 180.

The seed layer 152 can be deposited using vapor deposition techniques, such as PVD, CVD, atomic layer deposition, and/or plating. The seed layer 152 can be composed of Cu or other suitable materials. The thickness of the seed layer 152 may be about 2000 Angstroms, but could be more or less depending on the depth and aspect ratio of the hole 180. The conductive layer 154 can be Cu that is deposited onto the seed layer 152 in an electroless plating operation, electroplating operation, or another suitable method. The thickness of the conductive layer 154 can be about 1 micron, however, in other embodiments the conductive layer 154 can have a different thickness and/or include other suitable materials. In additional embodiments, the workpiece 100 may include a second conductive layer (not shown) that is deposited over the conductive layer 154 in the hole 180. The second conductive layer can be Ni or other suitable materials that function as a wetting agent for facilitating deposition of subsequent materials into the hole 180.

The conductive fill material 156 can include Cu, Ni, Co, Ag, Au, SnAgCu solder, AuSn solder, a solder having a different composition, or other suitable materials or alloys of materials having the desired conductivity. The conductive fill material 156 may be deposited into the hole 180 using plating processes, solder wave processes, screen printing processes, reflow processes, vapor deposition processes, or other suitable techniques. In other embodiments, the interconnects may have a different structure. For example, the interconnects may have additional layers in lieu of or in addition to the layers described above.

Figure 1C:
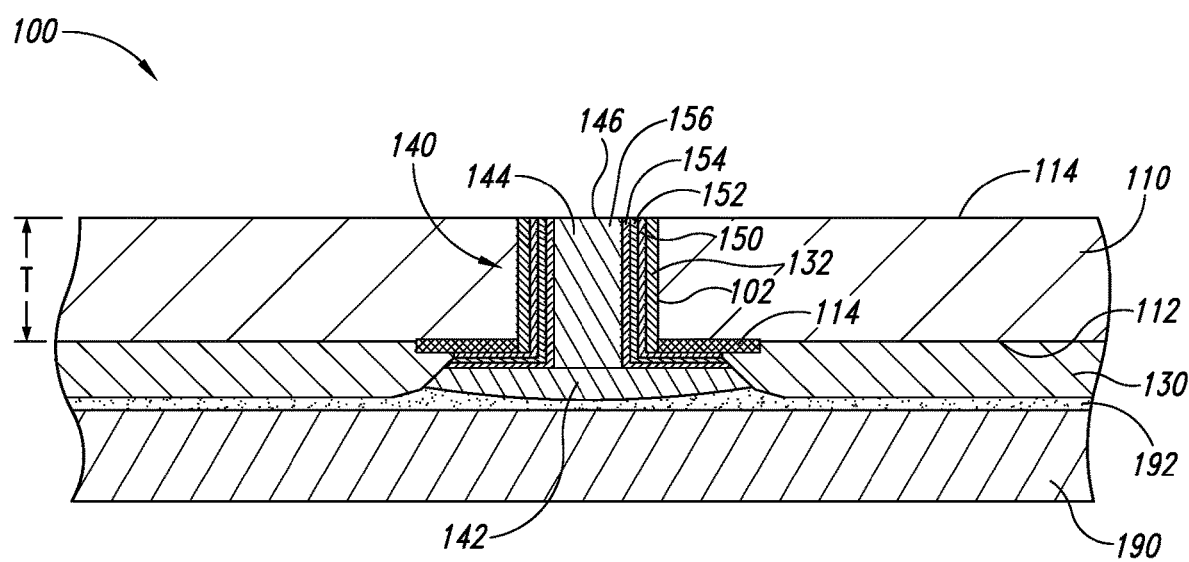

FIG. 1C is a schematic side cross-sectional view of the portion of the workpiece 100 after thinning the substrate 110 from the second side 114. The substrate 110 can be thinned by grinding, dry etching, chemical etching, chemical polishing, chemical-mechanical polishing, or other suitable processes. The thinning process may also remove a section of the second end portion 114 of the interconnect 140. For example, in one embodiment, the initial thickness of the substrate 110 is approximately 750 microns and the interconnect 140 extends to an intermediate depth of approximately 150 microns in the substrate 110, and the post-thinning thickness T of the substrate 110 is approximately 140 microns. These thicknesses can be different in other embodiments. After thinning the workpiece 100, the illustrated interconnect 140 includes an exposed surface 146 at the second end portion 144.

Figure 1D:
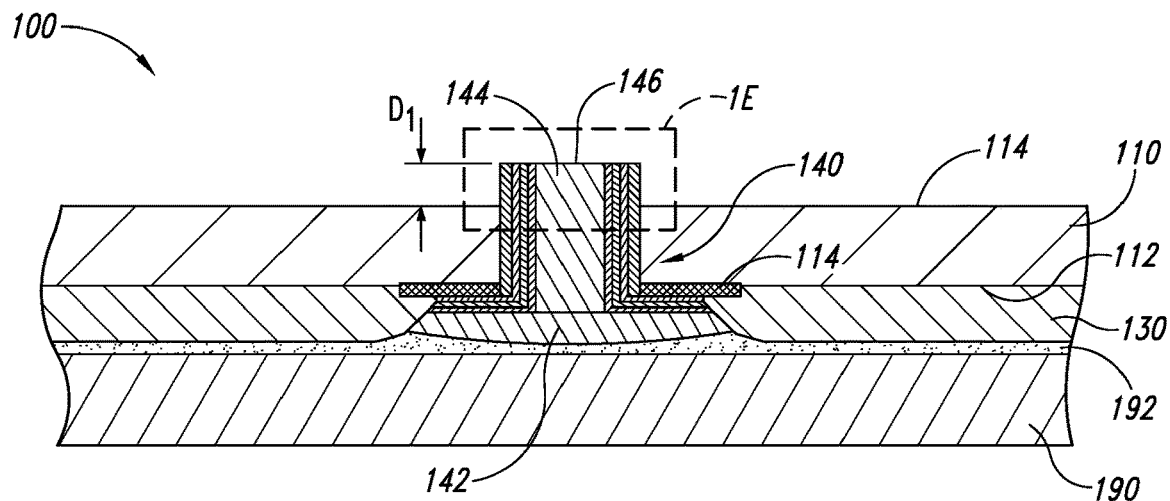

FIG. 1D is a schematic side cross-sectional view of the portion of the workpiece 100 after selectively removing additional material from the second side 114 of the substrate 110 so that the interconnect 140 projects from the substrate 110. The additional material can be removed via a plasma etch with $SF_6$ or another suitable etchant that is selective to silicon. Alternatively, the additional material can be removed with other processes. In either case, after thinning the substrate 110, the second end portion 144 of the interconnect 140 projects a first distance $D_1$ from the second side of the substrate 110. In several embodiments, the first distance $D_1$ is between approximately 5 and 10 microns, although the first distance $D_1$ can be less than 5 microns or more than 10 microns in other embodiments. The first distance $D_1$ is selected based on the subsequent processing and application requirements.

Figure 1E:
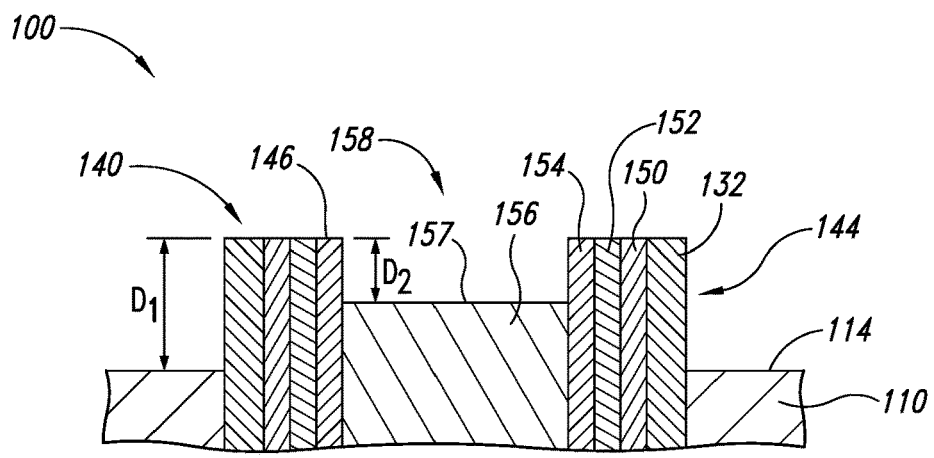

FIG. 1E is a schematic side cross-sectional view of the area 1E shown in FIG. 1D after forming a recess 158 in the second end portion 144 of the interconnect 140. In the illustrated embodiment, the recess 158 is formed by removing a portion of the conductive fill material 156 from the interconnect 140. The conductive fill material 156 can be removed by a wet etch process with an etchant that is selective to the conductive fill material 156 and, consequently, removes the conductive fill material 156 at a faster rate than the seed and/or conductive layers 152 and/or 154. The illustrated recess 158 extends from the surface 146 of the interconnect 140 to a surface 157 of the conductive fill material 156, and has a depth $D_2$ less than the first distance $D_1$. The depth $D_2$ of the recess 158 is selected based on the subsequent processing and application requirements. In other embodiments, such as the embodiments described below with reference to FIGS. 2A-3C, the interconnects may not include a recess in the second end portion 144.

Figure 1F:
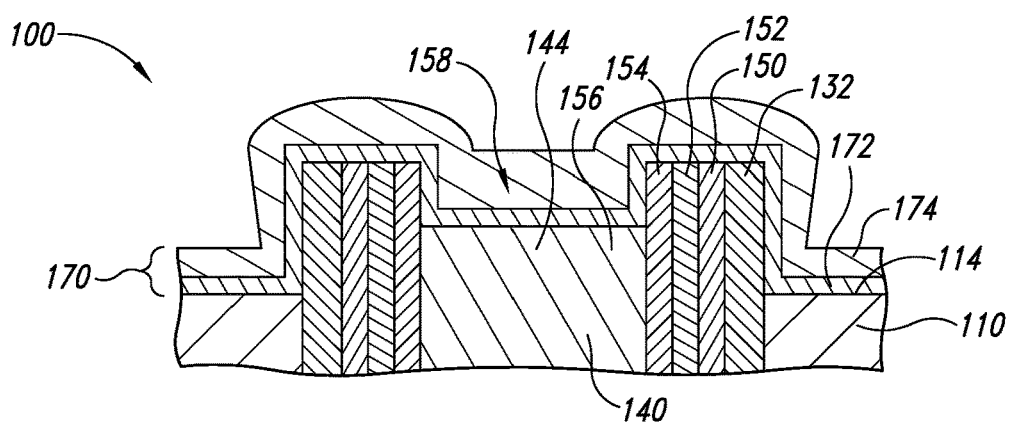

FIG. 1F is a schematic side cross-sectional view of the portion of the workpiece 100 after forming a dielectric structure 170 across the second side 114 of the substrate 110 and the second end portion 144 of the interconnect 140. The illustrated dielectric structure 170 includes a first dielectric layer 172 and a second dielectric layer 174 deposited on the first dielectric layer 172. The first dielectric layer 172 can be parylene HT and have a thickness of approximately 0.5 micron. In other embodiments, other dielectric materials can be used and/or have different thicknesses. The second dielectric layer 174 can be an oxide such as silicon oxide ($SiO_2$) and/or other suitable materials that are deposited by chemical vapor deposition and/or other suitable processes. In additional embodiments, the dielectric structure 170 can include a different number of layers.

Figure 1G:
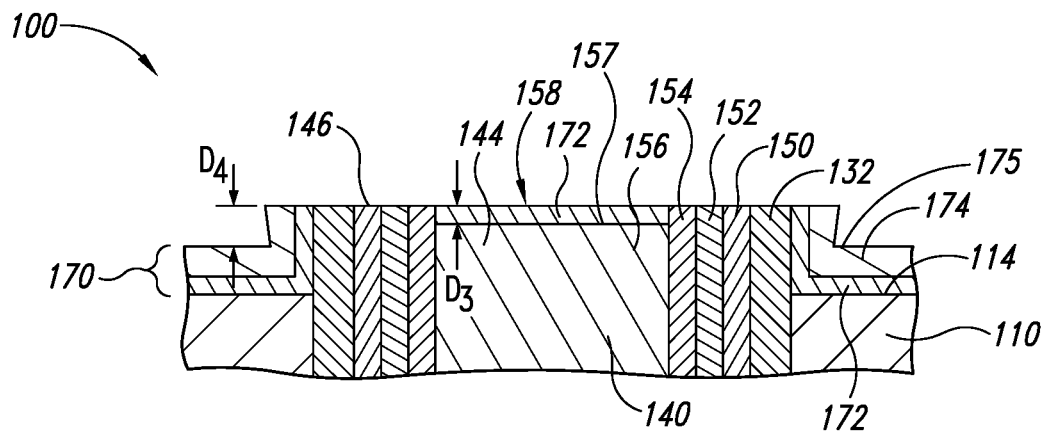

FIG. 1G is a schematic side cross-sectional view of the portion of the workpiece 100 after removing sections of the interconnect 140 and the dielectric structure 170. The sections of the interconnect 140 and the dielectric structure 170 can be removed by grinding, dry etching, chemical etching, chemical polishing, chemical-mechanical polishing, or other suitable processes. In the illustrated embodiment, the workpiece 100 is polished to remove portions of the second dielectric layer 132, the barrier layer 150, the seed layer 152, the conductive layer 154, the first dielectric layer 172, and the second dielectric layer 174. The volume of material removed is selected so that (a) the recess 158 in the interconnect 140 has a desired depth $D_3$, and (b) the interconnect 140 projects a desired distance $D_4$ from an exterior surface 175 of the dielectric structure 170. In other embodiments, such as the embodiment described below with reference to FIGS. 3A-3C, the interconnect may not project from the exterior surface 175 of the dielectric structure 170. In either case, the interconnect 140 intersects a plane defined by the dielectric structure 170.

Figure 1H:
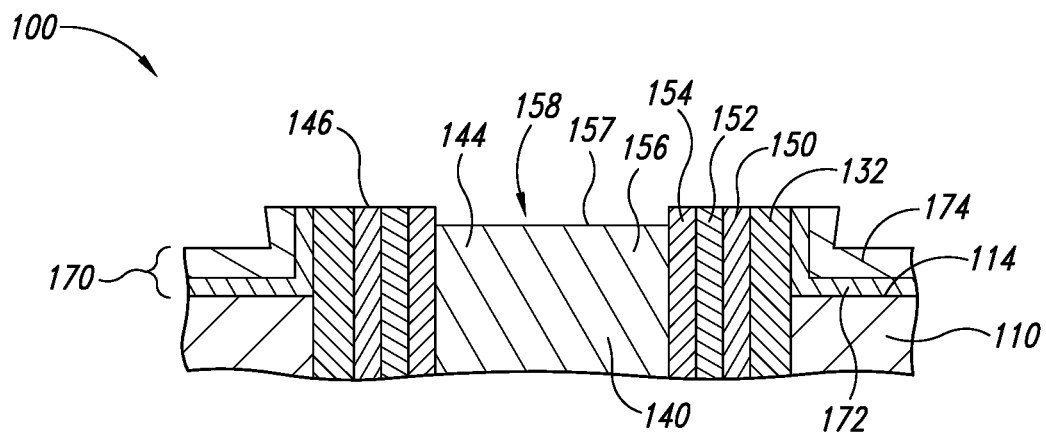

FIG. 1H is a schematic side cross-sectional view of the portion of the workpiece 100 after removing the section of the first dielectric layer 172 from the recess 158 in the interconnect 140. The section of the first dielectric layer 172 can be removed from the recess 158 by a plasma etching process (e.g., $O_2$ plasma) or another suitable method that selectively removes the first dielectric layer 172 without significantly effecting the dielectric structure 170 formed on the substrate 110.

Figure 1I:
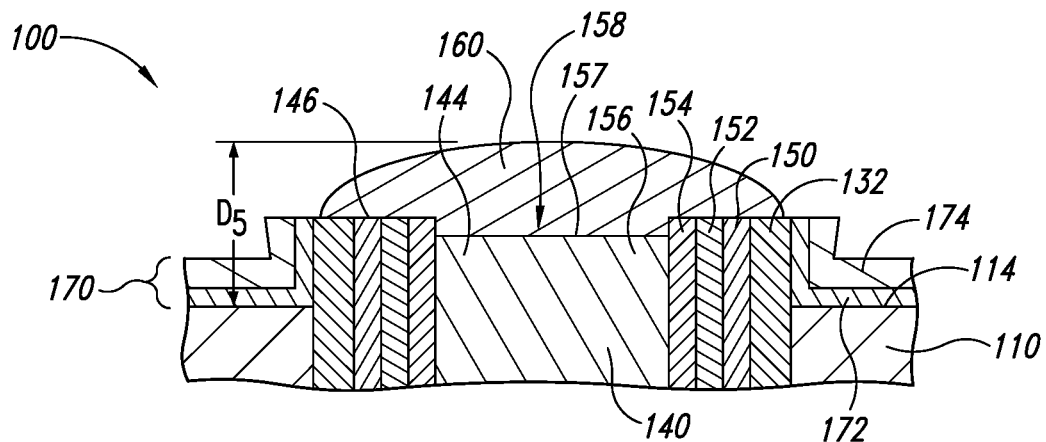

FIG. 1I is a schematic side cross-sectional view of the portion of the workpiece 100 after forming a conductive member 160 on the second end portion 144 of the interconnect 140. The illustrated conductive member 160 is a cap disposed in the recess 158 and extending over the barrier layer 150, the seed layer 152, and the conductive layer 154. The cap projects a desired distance $D_5$ from the substrate 110 and forms an external contact for connection to an external device. The conductive member 160 can be electrolessly plated onto the second end portion 144 of the interconnect 140 or formed using other suitable processes. The conductive member 160 can include Ni or other suitable conductive materials. In other embodiments, the interconnect 140 may not include the conductive member 160. For example, the second end portion 144 of the interconnects 140 can be attached directly to an external device, or a conductive coupler (e.g., a solder ball) can be attached directly to the second end portion 144.

One feature of the method illustrated in FIGS. 1A-1I is that the interconnect 140 projects from the substrate 110. As a result, the section of the dielectric structure 170 covering the interconnect 140 can be removed by a simple polishing process without exposing the backside of the substrate 110. The resulting exposed surface 146 on the interconnect 140 may form an external contact to which an external device can be attached. Alternatively, the conductive member 160 can be disposed on the exposed surface 146 and form the external contact. In either case, an advantage of this feature is that the illustrated method does not require expensive and time-consuming photolithography processes to form external contacts on the backside of the workpiece 100.

Another advantage of the method illustrated in FIGS. 1A-1I is that the interconnect 140 can be sized to project a desired distance from the external surface 175 of the dielectric structure 170. The distance can be selected based on the application requirements for the die 110. For example, in applications in which the die 110 is stacked on another die, the distance may be selected to provide a desired gap between the two dies.

Figure 2A:
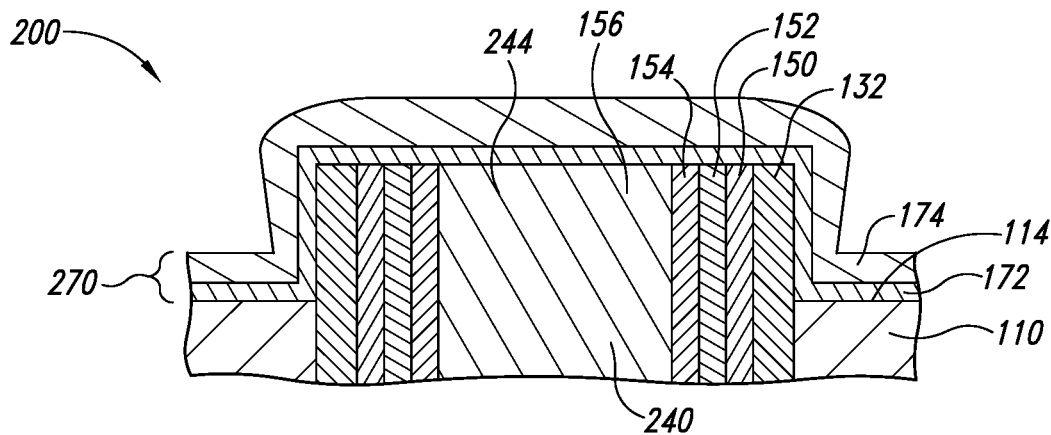
FIGS. 2A-2C illustrate stages in a method for forming interconnects in a microfeature workpiece in accordance with another embodiment of the invention.
Figure 2B:
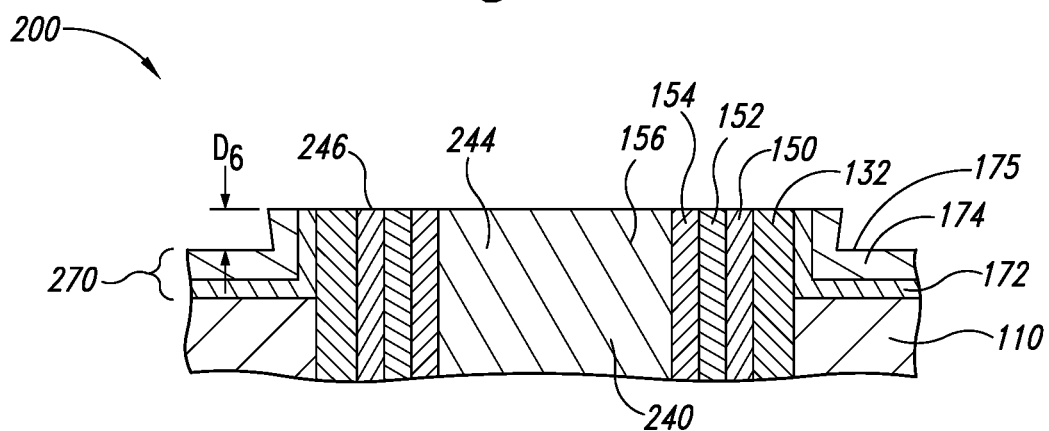
Figure 2C:
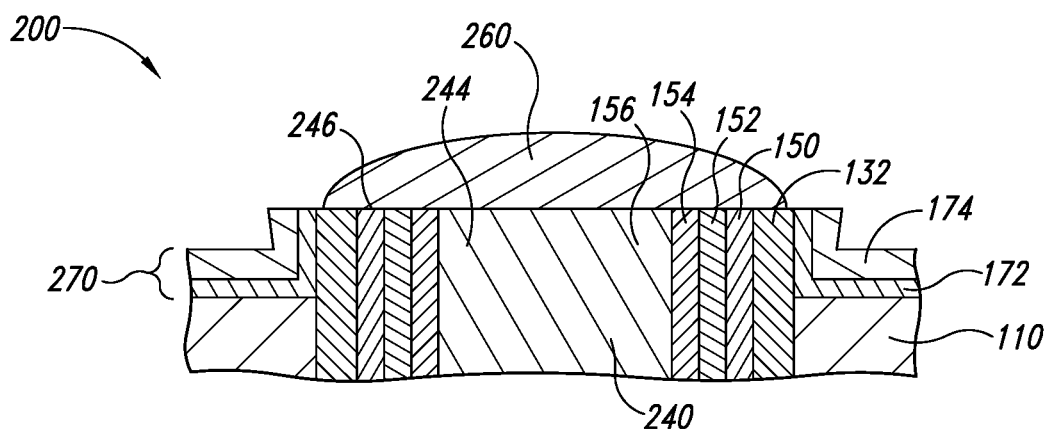

C. Additional Embodiments of Methods for Forming Interconnects in Microfeature Workpieces FIGS. 2A-2C illustrate stages in a method for forming interconnects in a microfeature workpiece 200 in accordance with another embodiment of the invention. FIG. 2A, for example, is a schematic side cross-sectional view of a portion of the workpiece 200 at an intermediate stage after partially forming an interconnect 240. The illustrated workpiece 200 is generally similar to the workpiece 100 described above with reference to FIGS. 1A-1F. For example, the illustrated workpiece 200 includes a substrate 110, an interconnect 240 extending through and projecting from the substrate 110, and a dielectric structure 270 formed over the substrate 110 and the interconnect 240. The illustrated interconnect 240, however, does not include a recess at the second end portion 244.

FIG. 2B is a schematic side cross-sectional view of the portion of the workpiece 200 after removing sections of the interconnect 240 and the dielectric structure 270. The sections of the interconnect 240 and the dielectric structure 170 can be removed by grinding, dry etching, chemical etching, chemical polishing, chemical-mechanical polishing, or other suitable processes. The volume of the material removed is selected so that the interconnect 240 projects a desired distance $D_6$ from an exterior surface 275 of the dielectric structure 270. The illustrated interconnect 240 includes a generally planar exposed surface 246 extending across the barrier layer 150, the seed layer 152, the conductive layer 154, and the conductive fill material 156.

FIG. 2C is a schematic side cross-sectional view of the portion of the workpiece 200 after forming a conductive member 260 on the generally planar exposed surface 246 of the interconnect 240. The conductive member 260 forms part of the electrically conductive interconnect 240 and, accordingly, is electrically coupled to the terminal 114 (FIG. 1B).

Figure 3A:
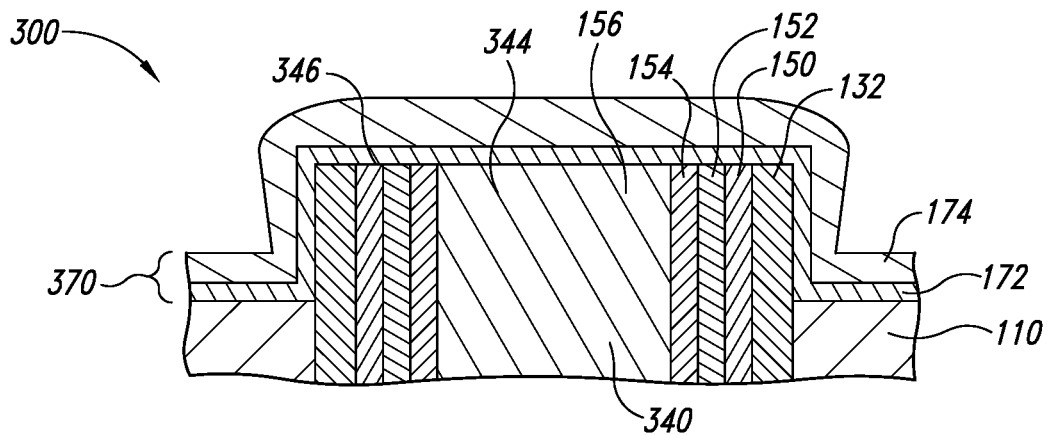
FIGS. 3A-3C illustrate stages in a method for forming interconnects in a microfeature workpiece in accordance with another embodiment of the invention.
Figure 3B:
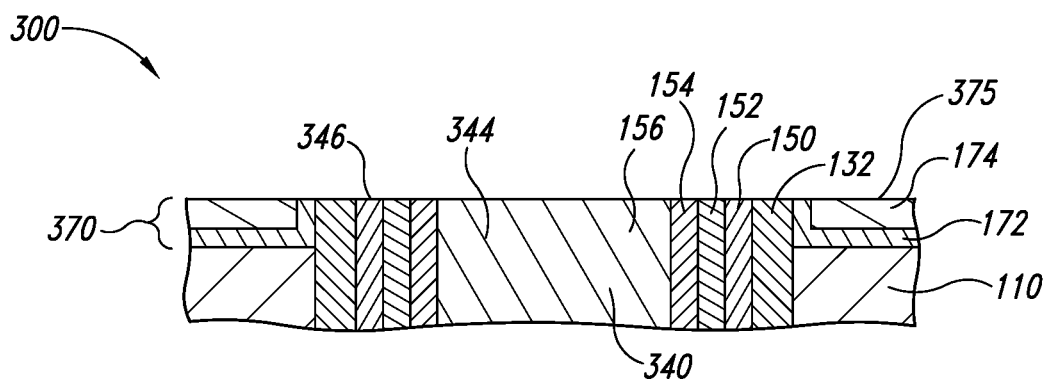
Figure 3C:
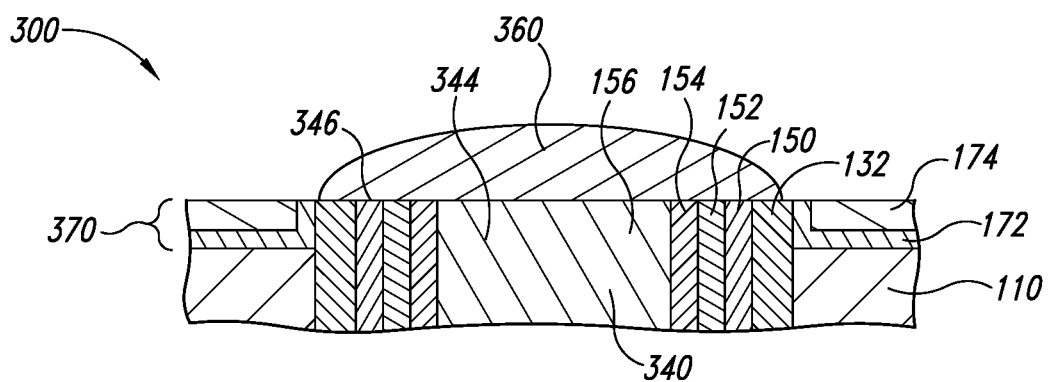

FIGS. 3A-3C illustrate stages in a method for forming interconnects in a microfeature workpiece 300 in accordance with another embodiment of the invention. FIG. 3A, for example, is a schematic side cross-sectional view of a portion of the workpiece 300 at an intermediate stage after partially forming an interconnect 340. The illustrated workpiece 300 is generally similar to the workpiece 200 described above with reference to FIG. 2A. For example, the illustrated workpiece 300 includes a substrate 110, an interconnect 340 extending through and projecting from the substrate 110, and a dielectric structure 370 formed over the substrate 110 and the interconnect 340.

FIG. 3B is a schematic side cross-sectional view of the portion of the workpiece 300 after removing sections of the interconnect 340 and the dielectric structure 370. The sections of the interconnect 340 and the dielectric structure 370 are removed to form a generally planar surface across the workpiece 300 such that an exposed surface 346 of the interconnect 340 is generally coplanar with an exterior surface 375 of the dielectric structure 370.

FIG. 3C is a schematic side cross-sectional view of the workpiece 300 after forming a conductive member 360 on the exposed surface 346 of the interconnect 340. The conductive member 360 forms part of the electrically conductive interconnect 340 and, accordingly, is electrically coupled to the terminal 114 (FIG. 1B).

From the foregoing, it will be appreciated that specific embodiments of the invention have been described herein for purposes of illustration, but that various modifications may be made without deviating from the spirit and scope of the invention. For example, many of the elements of one embodiment can be combined with other embodiments in addition to or in lieu of the elements of the other embodiments. Accordingly, the invention is not limited except as by the appended claims.

We claim:

1. An integrated circuit structure, comprising:
   an integrated circuit substrate having a conductive pad on a first face thereof and a through hole that extends through the integrated circuit substrate and the pad; and
   an electrically conductive interconnect in the through hole and through and onto the pad, the electrically conductive interconnect filling the through hole adjacent the first face, and including a recess therein adjacent a second face of the integrated circuit substrate, the recess defining inner walls of the conductive electrode, wherein the recess has a depth less than or equal to a thickness of an insulating layer over the second face of the integrated circuit substrate.

2. The integrated circuit structure of claim 1, further comprising:
   a conductive bump that extends into the recess and directly contacts the inner walls of the conductive electrode.

3. The integrated circuit structure of claim 2, wherein the conductive bump comprises nickel (Ni).

4. The integrated circuit structure of claim 2, wherein the conductive bump completely fills the recess.

5. The integrated circuit structure of claim 1, further comprising a seed layer between the electrically conductive interconnect and the substrate in the through hole.

6. The integrated circuit structure of claim 5, wherein the seed layer comprises copper (Cu).

7. The integrated circuit structure of claim 1, wherein the electrically conductive interconnect comprises copper (Cu), nickel (Ni), cobalt (Co), silver (Ag), gold (Au), tin (Sn), or a combination thereof.

* * * * *